(12) United States Patent
Bian et al.

(10) Patent No.: US 9,105,596 B2
(45) Date of Patent: Aug. 11, 2015

(54) MOTOR CONTROLLER

(71) Applicant: Zhongshan Broad-Ocean Motor Manufacturing Co., Ltd., Zhongshan (CN)

(72) Inventors: Wenqing Bian, Zhongshan (CN); Chongsheng Zeng, Zhongshan (CN)

(73) Assignee: Zhongshan Broad-Ocean Motor Manufacturing Co., Ltd., Zhongshan (CN)

( * ) Notice: Subject to any disclaimer, the term of this patent is extended or adjusted under 35 U.S.C. 154(b) by 286 days.

(21) Appl. No.: 13/844,421

(22) Filed: Mar. 15, 2013

(65) Prior Publication Data
US 2014/0029202 A1 Jan. 30, 2014

(30) Foreign Application Priority Data

Jul. 28, 2012 (CN) .................... 2012 2 0370329 U

(51) Int. Cl.
H05K 7/20 (2006.01)
H01L 23/36 (2006.01)
H01L 23/473 (2006.01)

(52) U.S. Cl.
CPC ............ *H01L 23/36* (2013.01); *H05K 7/209* (2013.01); *H05K 7/20445* (2013.01); *H01L 2924/0002* (2013.01)

(58) Field of Classification Search
CPC ............ H05K 7/20218–7/20381; H05K 7/20409–7/20418; H05K 7/20009–7/202; H01L 23/473; H01L 23/367–23/3677; H01L 23/46–23/467; G06F 1/181–1/182
USPC ........... 361/679.46–679.54, 688–723, 361/676–678; 165/80.1–80.5, 104.33, 185; 174/15.1–15.3, 16.1–16.3, 547–548; 257/712–722, E23.088
See application file for complete search history.

(56) References Cited

U.S. PATENT DOCUMENTS

| | | | | |
|---|---|---|---|---|
| 5,006,744 A * | 4/1991 | Archer et al. | ................... | 310/89 |
| 5,119,466 A * | 6/1992 | Suzuki | ........................... | 388/831 |
| 6,236,566 B1 * | 5/2001 | Regnier et al. | ................ | 361/699 |
| 6,278,179 B1 * | 8/2001 | Mermet-Guyennet | ....... | 257/686 |
| 7,122,928 B2 * | 10/2006 | Shindo | ............................ | 310/89 |
| 7,207,187 B2 * | 4/2007 | Funahashi et al. | ............ | 62/228.4 |
| 7,349,214 B2 * | 3/2008 | Jeong | ............................. | 361/704 |
| 7,656,016 B2 * | 2/2010 | Yoshimatsu et al. | .......... | 257/686 |
| 7,710,721 B2 * | 5/2010 | Matsuo et al. | ................ | 361/699 |
| 7,723,846 B2 * | 5/2010 | Ikawa et al. | .................... | 257/732 |
| 7,733,650 B2 * | 6/2010 | Okayama et al. | ............. | 361/704 |
| 7,944,695 B2 * | 5/2011 | Nuki | ............................. | 361/703 |
| 7,965,510 B2 * | 6/2011 | Suzuki et al. | ................ | 361/699 |
| 8,072,760 B2 * | 12/2011 | Matsuo et al. | ................ | 361/707 |
| 8,339,004 B2 * | 12/2012 | Tang et al. | ....................... | 310/89 |
| 8,582,291 B2 * | 11/2013 | Nakasaka et al. | ........ | 361/679.47 |

(Continued)

*Primary Examiner* — Anthony Haughton
*Assistant Examiner* — Razmeen Gafur
(74) *Attorney, Agent, or Firm* — Matthias Scholl P.C.; Matthias Scholl

(57) ABSTRACT

A motor controller, including: a control box (1), the control box (1) including a bottom, the bottom including a plurality of first bosses (11); a control panel (2); a plurality of IGBT modules (3); and a heat dissipation boss (12), the heat dissipation boss (12) including an end surface. The control panel (2) is disposed and fixed on the first bosses (11) by screws. The IGBT modules (3) are disposed on the control panel (2). The heat dissipation boss (12) is disposed on the bottom of the control box (1) outside the control panel (2). The IGBT modules (3) are attached to and fixed on the end surface of the heat dissipation boss (12) by a locking device.

2 Claims, 6 Drawing Sheets

(56) References Cited

U.S. PATENT DOCUMENTS

| | | | |
|---|---|---|---|
| 8,848,370 B2* | 9/2014 | Shin et al. | 361/699 |
| 8,885,344 B2* | 11/2014 | Asakura et al. | 361/715 |
| 2003/0200761 A1* | 10/2003 | Funahashi et al. | 62/228.4 |
| 2004/0145860 A1* | 7/2004 | Shindo | 361/622 |
| 2006/0158853 A1* | 7/2006 | Jeong | 361/704 |
| 2007/0253164 A1* | 11/2007 | Matsuo et al. | 361/699 |
| 2008/0007919 A1* | 1/2008 | Isomoto et al. | 361/709 |
| 2008/0049476 A1* | 2/2008 | Azuma et al. | 363/131 |
| 2008/0049477 A1* | 2/2008 | Fujino et al. | 363/131 |
| 2008/0158824 A1* | 7/2008 | Aoki et al. | 361/711 |
| 2009/0244845 A1* | 10/2009 | Nagamoto et al. | 361/697 |
| 2010/0025126 A1* | 2/2010 | Nakatsu et al. | 180/65.1 |
| 2010/0039776 A1* | 2/2010 | Nuki | 361/710 |
| 2010/0097765 A1* | 4/2010 | Suzuki et al. | 361/699 |
| 2010/0232111 A1* | 9/2010 | Baker et al. | 361/699 |
| 2011/0051371 A1* | 3/2011 | Azuma et al. | 361/699 |
| 2011/0194249 A1* | 8/2011 | Nakasaka et al. | 361/689 |
| 2011/0298321 A1* | 12/2011 | Tang et al. | 310/71 |
| 2013/0039009 A1* | 2/2013 | Shin et al. | 361/699 |

* cited by examiner

MOTOR CONTROLLER

CROSS-REFERENCE TO RELATED APPLICATIONS

Pursuant to 35 U.S.C. §119 and the Paris Convention Treaty, this application claims the benefit of Chinese Patent Application No. 201220370329.3 filed Jul. 28, 2012, the contents of which are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a motor controller.

2. Description of the Related Art

A typical motor controller includes: a control box, a control panel, and a plurality of IGBT (Insulated Gate Bipolar Transistor) modules. The IGBT modules are disposed on the control panel, and the control panel is arranged inside the control box. In order to improve heat dissipation property of the IGBT modules which produce a large amount of heat, a heat dissipation device is added and disposed on the control box. However, the motor controller of such a structure has the following defects: 1) adding the heat dissipation device results in a complex structure, cumbersome production procedure, inconvenient installation, and high production cost; 2) the heat dissipation device has a relative large volume, which has a low versatility, and is only suitable to few motor controllers; and 3) the installation of the IGBT modules on the heat dissipation device results in a compact structure, and a poor heat dissipation effect.

SUMMARY OF THE INVENTION

In view of the above-described problems, it is one objective of the invention to provide a motor controller that has a simple structure, low cost, simplified production procedure, simple installation procedure, reasonable layout, and good effect in heat dissipation.

To achieve the above objective, in accordance with one embodiment of the invention, there is provided a motor controller comprising: a control box, the control box comprising a bottom comprising a plurality of first bosses; a control panel; a plurality of IGBT modules; and a heat dissipation boss, the heat dissipation boss comprising an end surface. The control panel is disposed and fixed on the first bosses by screws. The IGBT modules are disposed on the control panel. The heat dissipation boss is disposed on the bottom of the control box outside the control panel. The IGBT modules are attached to and fixed on the end surface of the heat dissipation boss by a locking device.

In a class of this embodiment, the locking device comprises: a compression bar, and a screw. The compression bar presses against two IGBT modules and is fixed on the heat dissipation boss by a screw.

In a class of this embodiment, a power panel is disposed inside the control box above the control panel. A plurality of second bosses are disposed on the bottom of the control box. The power panel is disposed and fixed on the second bosses by screws; and the power panel is in electric connection with the control box via a lead terminal.

In a class of this embodiment, a plurality of heat dissipation ribs are disposed on a bottom of the heat dissipation boss.

In a class of this embodiment, six IGBT modules are provided, and every two IGBT modules are defined as a group.

In a class of this embodiment, a height of the second bosses is larger than a height of the first bosses.

Advantages of the invention are summarized as follows:

1). The heat dissipation boss is disposed on the bottom of the control box outside the control panel. The IGBT modules are attached to the end surface of the heat dissipation boss by the locking device. The motor controller has a simple structure, low cost, simplified production procedure, simple installation procedure, reasonable layout, and good effect in heat dissipation.

2). The locking device comprises the compression bar and the screw. The compression bar presses against two IGBT modules and is fixed on the heat dissipation boss by the screw. The locking device is characterized in fastening installation and reasonable design.

3). The power panel is disposed inside the control box above the control panel. The power panel is disposed on a plurality of second bosses arranged on the bottom of the control box, and is fixed on the second bosses by screws. The power panel is in electric connection with the control box via a lead terminal. Thus, the electronic components integrated into one circuit board are arranged into two-layered circuit boards, thereby increasing the space between electronic components, and improving the effect of the heat dissipation.

4). A plurality of heat dissipation ribs are disposed on a bottom of the heat dissipation boss, which increases the heat dissipation area and the heat dissipation speed.

DETAILED DESCRIPTION OF THE EMBODIMENTS

For further illustrating the invention, experiments detailing a motor controller are described below combined with the drawings.

Example 1

Figure 1:
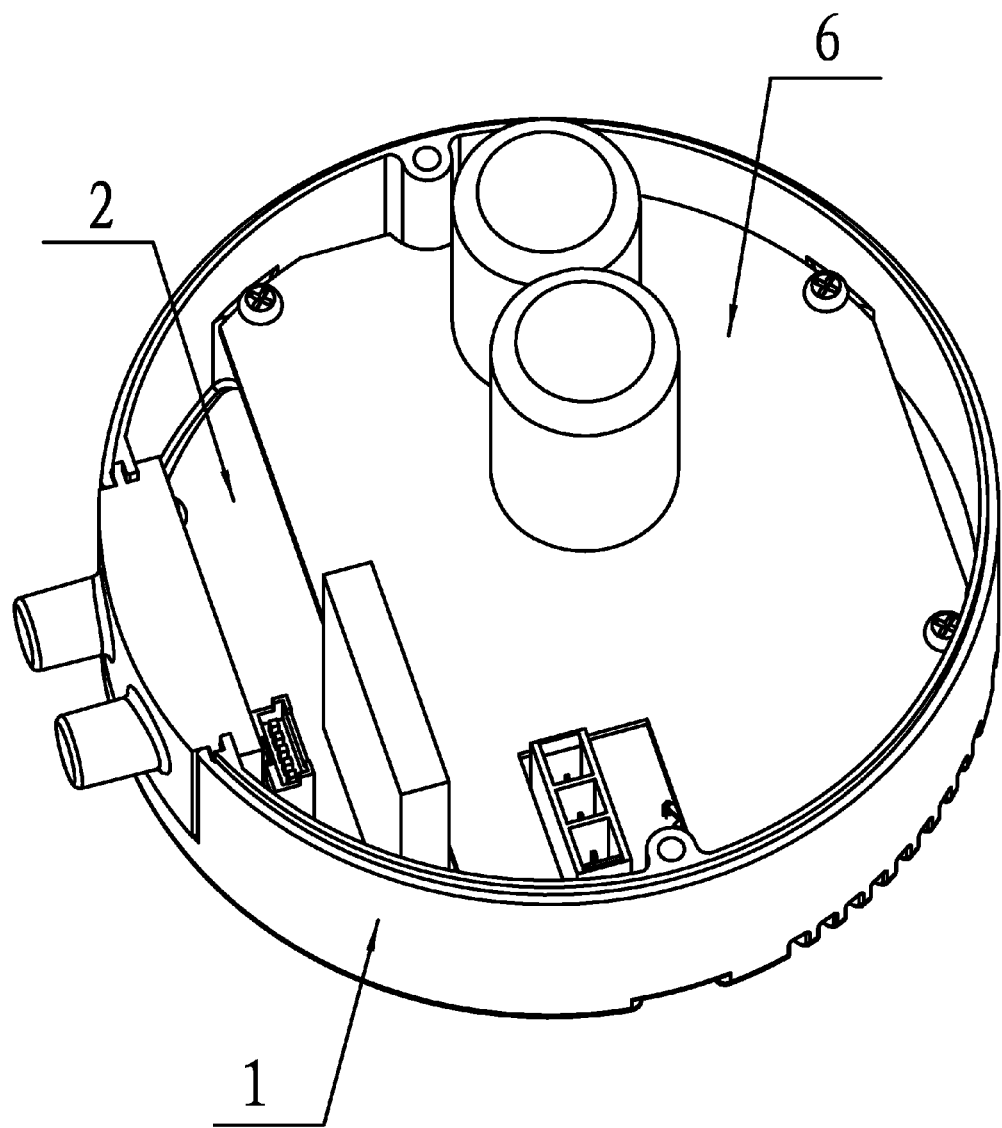
FIG. 1 is a stereogram of a motor controller of the invention.
Figure 2:
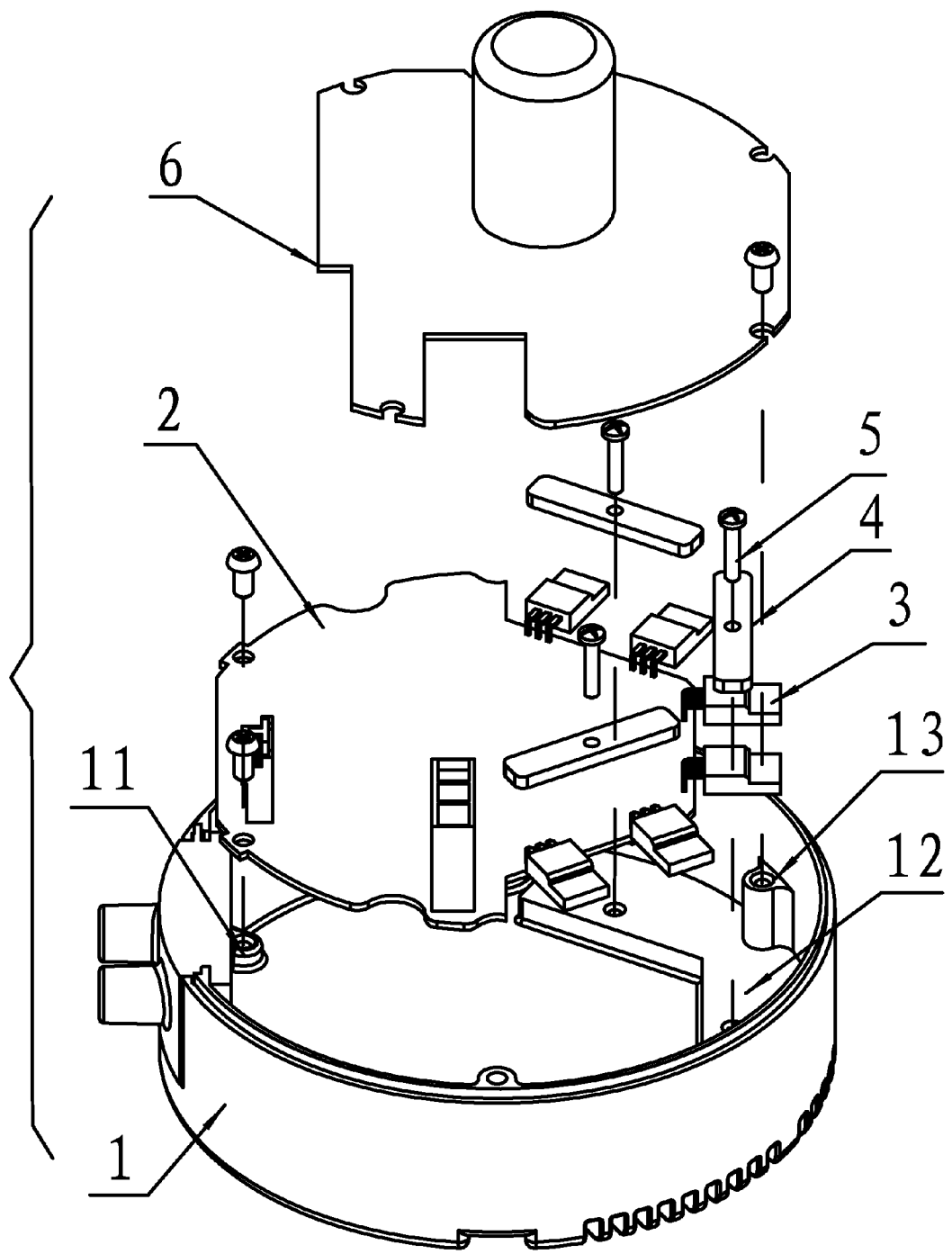
FIG. 2 is an exploded view of a motor controller of the invention.
Figure 3:
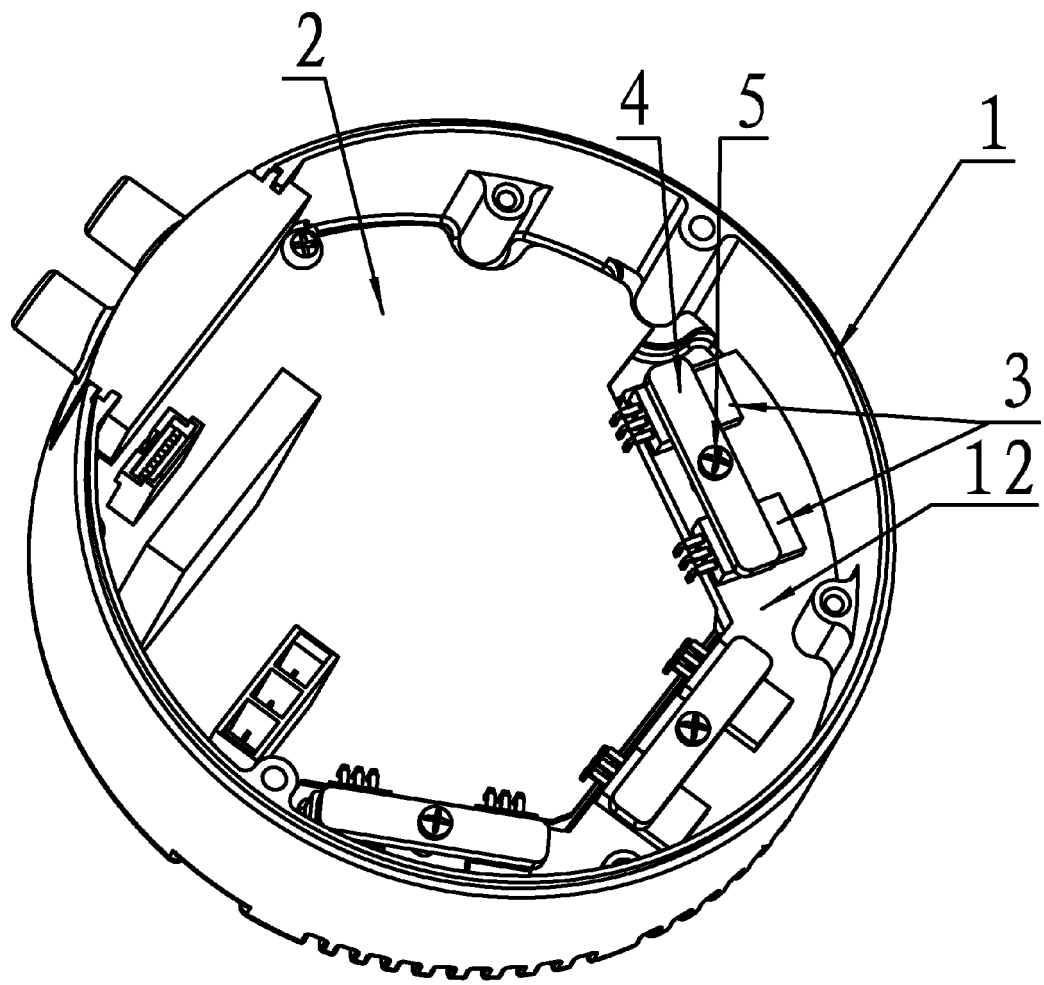
FIG. 3 is a assembly stereogram of a control box and a control panel of the invention.
Figure 4:
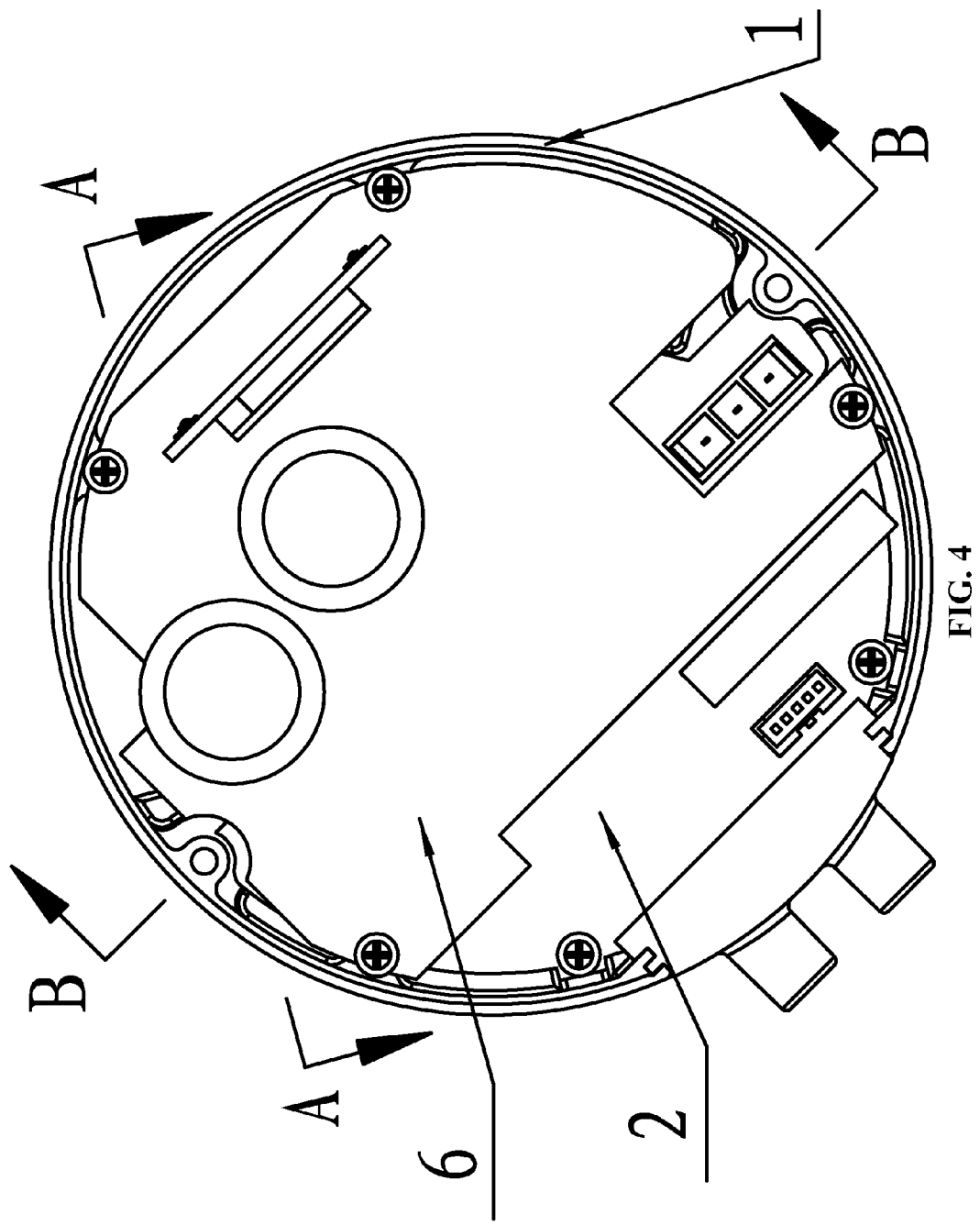
FIG. 4 is a structure diagram of a motor controller of the invention.
Figure 5:
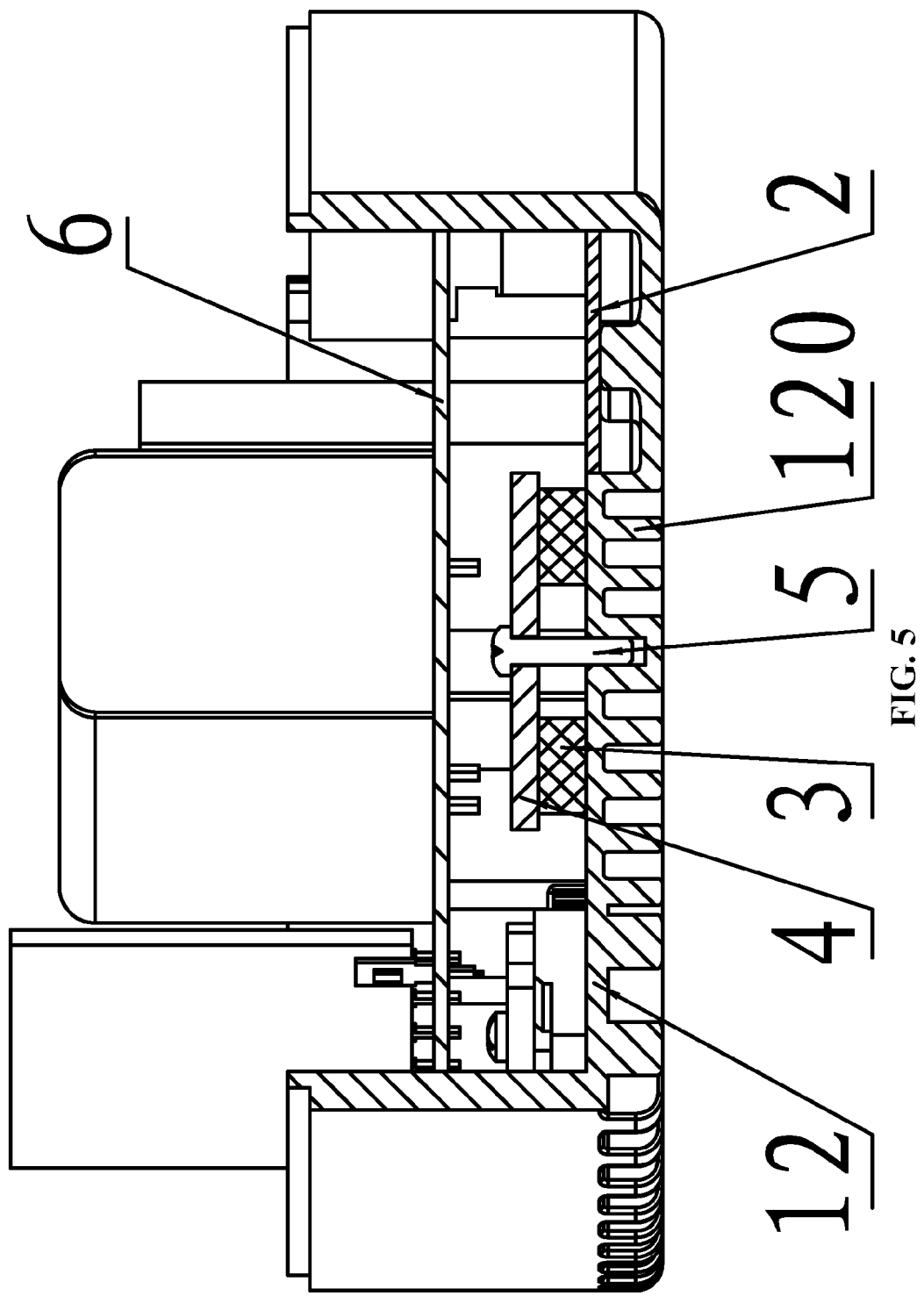
FIG. 5 is a cross-sectional view taken from part A-A of FIG. 4.
Figure 6:
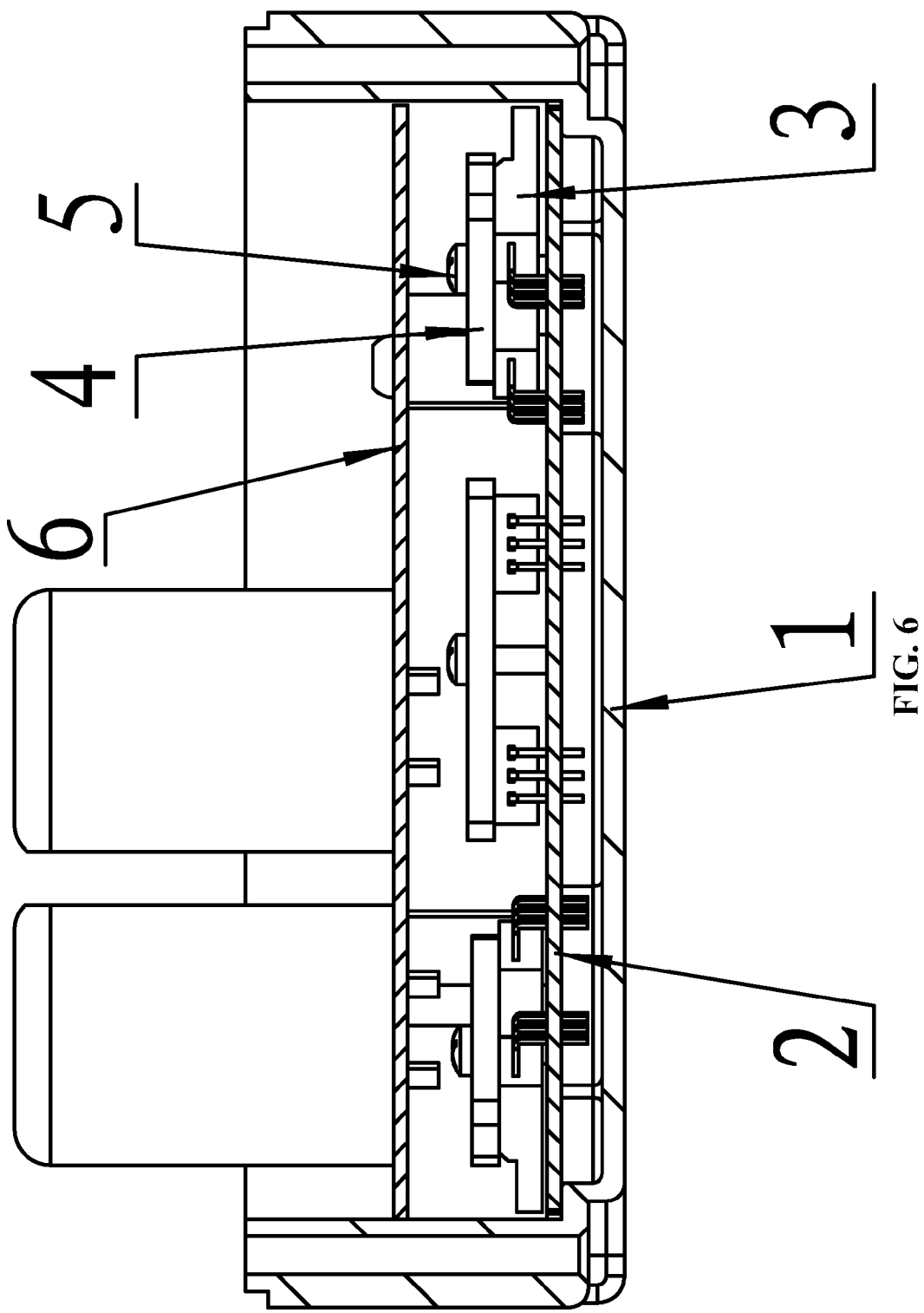
FIG. 6 is a cross-sectional view taken from part B-B of FIG. 4.

As shown in FIGS. 1-6, a motor controller comprises: a control box 1, a control panel 2, and a plurality of IGBT modules 3. A plurality of first bosses 11 are disposed on a bottom of the control box 1. The control panel 2 is disposed and fixed on the first bosses 11 by screws. The IGBT modules 3 are disposed on the control panel 2. A heat dissipation boss 12 is disposed on the bottom of the control box 1 outside the control panel 2. The IGBT modules 3 are attached to an end surface of the heat dissipation boss 12 by a locking device.

Example 2

Based on Example 1, the following technical features are added: the locking device comprises: a compression bar 4, and a screw 5. The compression bar 4 presses against two IGBT modules 3 and is fixed on the heat dissipation boss 12 by a screw 5.

Example 3

Based on Example 1 or 2, the following technical features are added: a power panel 6 is disposed inside the control box 1 above the control panel 2. The power panel 6 is disposed on a plurality of second bosses 13 arranged on the bottom of the control box 1, and is fixed on the second bosses 13 by screws. The power panel 6 is in electric connection with the control box 2 via a lead terminal.

Example 4

Based on Example 1 or 2, the following technical features are added: a plurality of heat dissipation ribs 120 are disposed on a bottom of the heat dissipation boss 12.

Example 5

Based on Example 1, the following technical features are added: six IGBT modules 3 are provided, and every two IGBT modules are defined as a group.

Example 6

Based on Example 3, the following technical features are added: a height of the second bosses 13 is larger than a height of the first bosses 11.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

A plurality of the first bosses 11 are disposed on the bottom of the control box 1. The control panel 2 is disposed and fixed on the first bosses 11 by screws. The IGBT modules 3 are disposed on the control panel 2. The heat dissipation boss 12 is disposed outside the control panel 2 on the bottom of the control box 1. The IGBT modules 3 are attached to the end surface of the heat dissipation boss 12 by the locking device. The invention has a simple structure, low cost, simplified production procedure, simple and easy installation procedure, reasonable layout, and good heat dissipation effect.

The invention claimed is:
1. A motor controller, comprising:
a) a control box, the control box comprising a bottom comprising a plurality of first bosses;
b) a control panel;
c) a plurality of IGBT modules; and
d) a heat dissipation boss, the heat dissipation boss comprising an end surface;
wherein
the control panel is disposed and is fixed on the first bosses by screws;
the IGBT modules are disposed on the control panel;
the heat dissipation boss is disposed on the bottom of the control box outside the control panel;
the IGBT modules are attached to and are fixed on the end surface of the heat dissipation boss by a locking device;
a power panel is disposed inside the control box above the control panel;
a plurality of second bosses are disposed on the bottom of the control box;
the power panel is disposed and is fixed on the second bosses by screws;
the power panel is in electric connection with the control box via a lead terminal; and
a height of the second bosses is larger than a height of the first bosses.

2. A motor controller, comprising:
a) a control box, the control box comprising a bottom comprising a plurality of first bosses;
b) a control panel;
c) a plurality of IGBT modules; and
d) a heat dissipation boss, the heat dissipation boss comprising an end surface;
wherein
the control panel is disposed and is fixed on the first bosses by screws;
the IGBT modules are disposed on the control panel;
the heat dissipation boss is disposed on the bottom of the control box outside the control panel;
the IGBT modules are attached to and are fixed on the end surface of the heat dissipation boss by a locking device;
the locking device comprises a compression bar and a screw;
the compression bar presses against two IGBT modules and is fixed on the heat dissipation boss by a screw;
a power panel is disposed inside the control box above the control panel;
a plurality of second bosses are disposed on the bottom of the control box;
the power panel is disposed and is fixed on the second bosses by screws;
the power panel is in electric connection with the control box via a lead terminal; and
a height of the second bosses is larger than a height of the first bosses.

* * * * *